United States Patent [19]

Silbernagel et al.

[11] Patent Number: 4,968,263

[45] Date of Patent: Nov. 6, 1990

[54] MULTI-PIN ELECTRICAL CONNECTOR WITH FLOATING TERMINAL PINS

[75] Inventors: Raymond A. Silbernagel, Naperville; Rupert J. Fry, Jr., Des Plaines, both of Ill.

[73] Assignee: Molex Incorporated, Lisle, Ill.

[21] Appl. No.: 500,359

[22] Filed: Mar. 28, 1990

[51] Int. Cl.⁵ .......................................... H01R 13/629
[52] U.S. Cl. ....................................... 439/246; 439/83; 439/741
[58] Field of Search .................... 439/246, 247–252, 439/74, 84, 741, 83, 692

[56] References Cited

U.S. PATENT DOCUMENTS

| | | | |
|---|---|---|---|
| 2,864,068 | 12/1958 | Roth | 439/252 |
| 2,878,587 | 3/1959 | Jubenville | 439/84 |
| 3,017,597 | 1/1962 | Nava et al. | 439/248 |
| 3,132,912 | 5/1964 | Friedman | 439/252 |
| 3,904,934 | 9/1975 | Martin | 439/74 |
| 4,854,882 | 8/1989 | Corridori | 439/246 |

FOREIGN PATENT DOCUMENTS

| | | | |
|---|---|---|---|
| 3005634 | 8/1981 | Fed. Rep. of Germany | 439/74 |
| 684703 | 12/1952 | United Kingdom | 439/252 |

OTHER PUBLICATIONS

IBM Technical Disclosure Bulletin, "Controlled Direction Buckling Beam", vol. 17, No. 5, Oct. 1974.

*Primary Examiner*—Gary F. Paumen
*Attorney, Agent, or Firm*—Louis A. Hecht; Stephen Z. Weiss; Charles S. Cohen

[57] ABSTRACT

A multi-pin electrical connector is adapted for surface mounting on a printed circuit board. The connector includes a header or housing having a plurality of pin-receiving through holes. A plurality of terminal pins are received in the holes of the header, with portions adapted for surface mounting on circuit traces on the printed circuit board. The terminal pins have spaced enlargements located on opposite sides of the header to retain the pins in the holes. The enlargements are spaced along the pins a distance greater than the thickness of the header about the holes whereby the pins can float in the holes to accommodate any non-uniform spacing between the header and the printed circuit board and ensure contact of the terminal pin portions with the circuit traces on the printed circuit board.

19 Claims, 2 Drawing Sheets

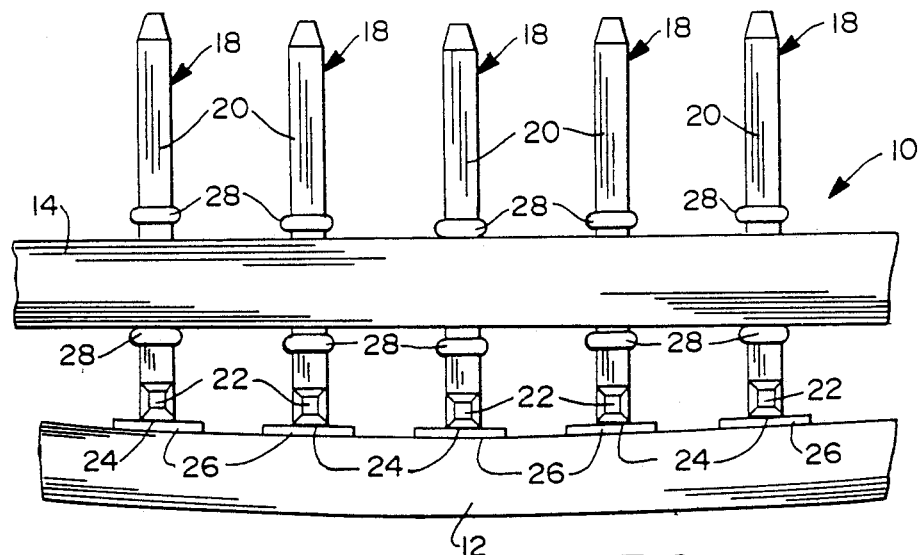
FIG.1
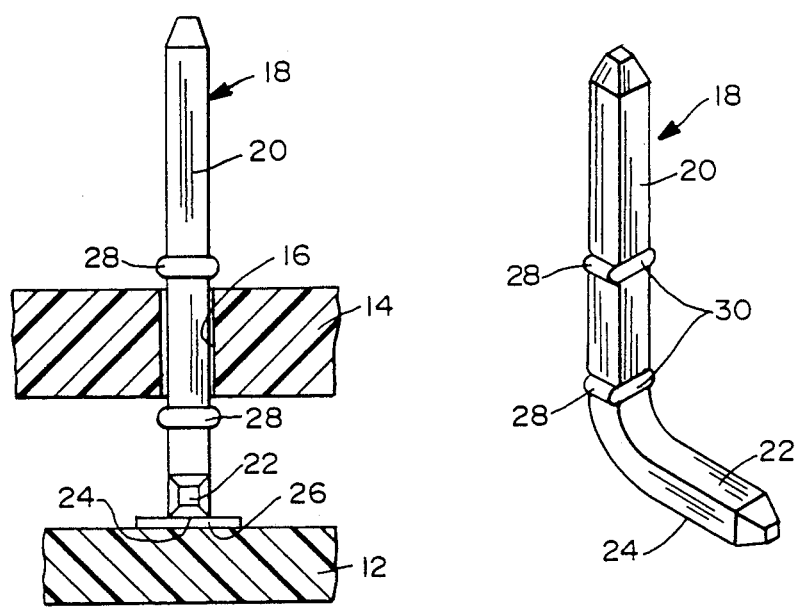
FIG.2
FIG.3

MULTI-PIN ELECTRICAL CONNECTOR WITH FLOATING TERMINAL PINS

FIELD OF THE INVENTION

This invention generally relates to electrical connectors and, particularly, to a multi-pin electrical connector adapted for mounting on a printed circuit board, with floating terminal pins to accommodate any non-uniform spacing between the connector and the printed circuit board.

BACKGROUND OF THE INVENTION

Multi-pin electrical connectors are widely used for connecting circuit traces on printed circuit boards with other printed circuit boards or with a complementary connector. For instance, the multi-pin connector may be a male plug having terminal pins mounted to or on the printed circuit board for conductively engaging circuit traces on the board, the pins of the male plug, in turn, being mateable with terminal contacts in a complementary female receptacle connectable with the male plug.

In some such arrangements, the terminal pins of the multi-pin connector have solder tails which are inserted through holes in the printed circuit board and soldered to surrounding circuit traces on the board for establishing electrical conductivity therewith. In other such arrangements, commonly termed surface mount technology, the solder pins are soldered to the circuit traces on the printed circuit board by surface engagement rather than extending through holes in the board.

One of the problems with multi-pin connectors of the character described, particularly those in which the solder tails of the pins are surface mounted to the board, is encountered when there is non-uniform spacing between the connector header or housing and the printed circuit board. In other words, the terminal pins are fabricated uniformly or identical to each other, with identical dimensions, including the length of the solder tails which project from the connector header or housing. Should the printed circuit board be warped, bent or have other irregularities resulting in non-uniform spacing between the connector header and the surface of the printed circuit board, some of the solder tails of the terminal pins end up being spaced from the circuit traces on the board, resulting in inferior solder connections or no connections at all. This is equally true if the circuit board, itself, is precisely planar, but the header or housing of the connector is not flat and has a bend therein or other irregular surface problems, again resulting in non-uniform spacing between the header and the board.

This invention is directed to solving these problems by providing a multi-pin electrical connector wherein the terminal pins are mounted on the header or housing of the connector in a manner to float (i.e., have limited movement in relation to the header or housing) to accommodate any non-uniform spacing between the header or housing and the printed circuit board.

SUMMARY OF THE INVENTION

An object, therefore, of the invention is to provide a new and improved multi-pin electrical connector adapted for surface mounting on a printed circuit board.

In the exemplary embodiment of the invention, the connector includes a header or housing having a plurality of pin-receiving through holes. A plurality of terminal pins are received in the holes of the header. The terminal pins have spaced enlargement means located thereon on opposite sides of the header to retain the pins in the holes. The enlargement means being are along the pins a distance greater than the thickness of the header about the holes, whereby the pins can float in the holes to accommodate any non-uniform spacing between the header and the printed circuit board.

In the preferred embodiment of the invention, the holes in the header have cross-sectional dimensions greater than the dimensions of the pins within the holes thereby allowing the pins to float by moving transversely, longitudinally and angularly pivoting in relation to the holes.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the following description taken in conjunction with the accompanying drawings, in which like reference numerals identify like elements in the figures and in which:

FIG. 1 is a fragmented elevational view of a multi-pin electrical connector having a header and a plurality of floating pins according to the invention, and illustrating the connector in conjunction with a printed circuit board which has a bow therein;

FIG. 2 is a vertical section through the header to illustrate one of the pin-receiving holes therein, with a terminal pin mounted in the hole;

FIG. 3 is a perspective view of one of the terminal pins according to the invention;

DETAILED DESCRIPTION OF THE PREFERRED EMBODIMENT

Figure 4:
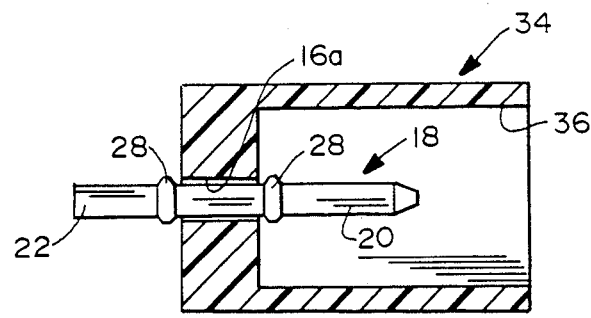
FIG. 4 is a fragmented horizontal section through another embodiment of a connector employing a connector housing with floating terminal pins according to the concepts of the invention.
Figure 5:
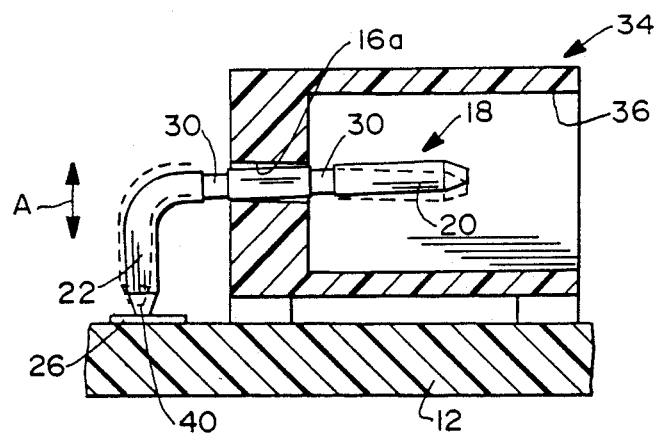
FIG. 5 is a vertical section taken generally along line 5—5 of FIG. 6.
Figure 6:
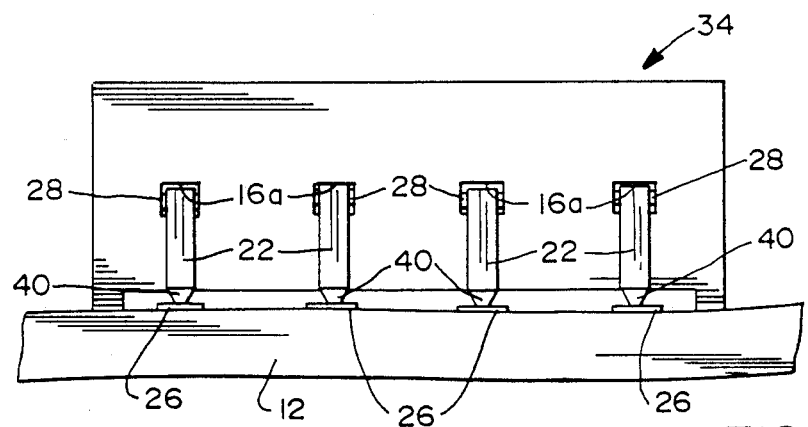
FIG. 6 is an elevational view of the embodiment of FIGS. 4 and 5, in conjunction with a printed circuit board with an uneven upper surface.

Referring to the drawings in greater detail, generally, FIGS. 1–3 show an electrical connector having terminal pins mounted in a header, and FIGS. 4–6 show an electrical connector having the terminal pins mounted in a housing, both embodiments being shown for establishing an electrical connection between the terminal pins and a printed circuit board.

More particularly, referring first to FIGS. 1–3, a multi-pin electrical connector, generally designated 10, is adapted for surface mounting on a printed circuit board 12 (FIG. 1). The connector includes a header 14 having a plurality of pin-receiving through holes 16 (FIG. 3).

A plurality of terminal pins, generally designated 18, are received in holes 16 of header 14 as best illustrated in FIG. 3. Each pin terminal 18 has a terminal portion 20 projecting upwardly (as viewed in the drawings) from header 14 and a solder tail portion 22 extending at a right-angle to terminal portion 20 and disposed below header 14. Solder tail portion 22 has a bottom surface 24 for surface engagement with and soldering to a printed circuit trace 26 on board 12.

Up to this point, it might be said that the construction of terminal pins 18 and their mounting in holes 16 of header 14 generally are conventional. However, heretofore such terminal pins predominantly have been press-fit into the holes in the header. This construction or assembly of the connector presents a number of problems, including the creation of stresses in the insulating material of which header 14 is fabricated. Such headers normally are molded and have built-in stresses due to the molding operation. Press-fitting terminal pins into the header compounds the stress problem. In addition, close tolerances had to be maintained between the dimensions of the pins and the dimensions of the holes in the header. Significantly, the tight press-fit mounting of the pins left no accommodation for irregularities in either the printed circuit board or the header which might cause non-uniform spacing between the header and the printed circuit board, which would result in the solder tail portions of some of the terminal pins being spaced from the circuit traces on the printed circuit board. Such spacing results in inferior solder connections or no connections at all.

FIG. 1 illustrates a common defect wherein it can be seen that printed circuit board 12 is bowed downwardly to create non-uniform spacing between the board and header 14. Conversely, the printed circuit board may be flat or planar and the header be bowed for one reason or another. Surface irregularities can cause non-uniform spacing between the header and the board. Heretofore, in order to combat such spacing problems, in order to ensure pin contact with the circuit traces on the printed circuit board, the pins were made to extremely close tolerances or were made of a thin material so that the pins could bend, either situation being undesirable.

The invention contemplates solving these problems by mounting terminal pins 18 in header 14 so that the pins can float in the holes to accommodate any non-uniform spacing between the header and the printed circuit board. More particularly, spaced enlargements 28 are located on terminal portion 20 of each terminal pin 18 to be located on opposite sides of header 14 to retain the pins in the holes but allow for floating action of the pins in the holes relative to the header, axially of the holes. This is accomplished, as seen in FIGS. 1 and 3, by spacing enlargements 28 a distance greater than the thickness of header 14, at least in the area of the header about the holes.

With a bowed or warped printed circuit board as shown in FIG. 1, it can be seen that the end-most terminal pins 18 are moved upwardly in their respective holes 16 (FIG. 3) with its lower enlargement in engagement with the bottom header 14. The center terminal pin is moved downwardly under gravity, whereby its upper enlargement 28 substantially rests on top of header 14 while the bottom surface 24 of solder tail portion 22 of that pin establishes surface contact with its respective circuit trace 26 located at the most extreme lower extent of the bow in the printed circuit board. The intermediate terminal pins, i.e., between the end-most pins and the center pin, float in their holes in the header as their bottom surfaces 24 establish surface engagement with their respective circuit traces 26 for subsequent soldering. The differential between the spacing between the enlargements on the terminal pins and the thickness of the header can be determined through manufacturing experience where bowing, warping or other irregularities are encountered during a mass production environment.

In manufacture, enlargements 28 can be provided in a variety of processes, one of which would be to coin or punch the enlargements of the pin blank whereby the enlargements are integral with the pin, as shown particularly in FIG. 2. In other words, there may be indentations 30 (FIG. 2) in opposite sides of the pin to cause material to bulge outwardly on the other two sides to form enlargements 28.

In assembly, only one of the enlargements, such as the bottom enlargement of each pin in FIGS. 1-3, would be punched or stamped into the pin blank. A plurality of such pre-punched pins then can be assembled to header 14, in a jig for instance, by inserting terminal portions 20 of the pins upwardly through holes 16 in the header. Once so assembled, the upper enlargement 28 can be stamped out of the blank while in the jig at a predetermined distance from the lower enlargements. The spaced enlargements thereby retain the pins in the holes of the header yet provide a floating action to accommodate any non-uniform spacing between the header and the printed circuit board to which the terminal pins are to be soldered.

FIG. 3 shows hole 16 having a cross-sectional dimension greater than the cross-dimensions of the pin within the hole. This is somewhat exaggerated in the figure to exemplify the fact that no stresses whatsoever are created by forcing pins through the insulating material of the header. On the other hand, the holes may be intentionally enlarged to provide floating action by allowing the pins to move transversely, longitudinally, and angularly pivoting in relation to the holes, as described below in relation to FIGS. 4-6.

More particularly, FIGS. 4-6 show terminal pins 18 mounted in holes 16a in the base 32 of a multi-pin connector housing, generally designated 34. Like numerals are applied to the portions of pins 18 corresponding to like portions described above in relation to FIGS. 1-3.

In the embodiment of FIGS. 4-6, connector housing 34 has sockets 36 and into which the terminal portions 20 of terminal pins 18 extend. Because the housing surrounding sockets 36 prevents access to the terminal portions of the pins for stamping purposes, the right-hand (as viewed in FIGS. 4 and 5) enlargements 28 of the terminal pins are pre-formed before the pins are inserted through holes 16a in base 32 of housing 34. To this end, the angled solder tail portion 22 of each pin originally may be collinear with terminal portion 20, prior to assembly in the housing, and then the solder tail portion can be bent while in the jig just as the left-hand enlargement is formed after insertion of the pin through the respective hole in the housing.

In the embodiment of FIGS. 4-6, it can be seen that the electrical connector is adapted for surface mounting and soldering of tips or distal ends 40 of the solder tails to circuit traces 26 on printed circuit board 12 (FIG. 6). Therefore, within the concepts of the invention, the terminal pins are provided with a floating action, generally in the direction of double-headed arrow A, by means of enlarging holes 16a in the housing in order that the terminal pins can sort of "teeter" or float within the holes to accommodate any non-uniform spacing between the housing and the printed circuit board.

Still further, the terminal pins in the embodiment of FIGS. 4-6 should be designed so that there is a greater pin mass outside the housing than inside the housing, i.e., on one side of the hole (the left side in FIGS. 4 and 5) versus the other side, whereby the greater mass can be utilized to ensure contact of the pin tips 40, by gravity, with the printed circuit traces on board 12. This can be accomplished simply by making the bent solder tail portion 22 longer than terminal portion 20. Sockets 36 form receptacles for receiving complementary connectors having terminal contacts for establishing electrical connection with terminal portions 20 of terminal pins 18.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A multi-pin electrical connector adapted for surface mounting on a printed circuit board, comprising:
    a header having a plurality of pin-receiving through holes;
    a plurality of male terminal pins of substanially constant cross section along the length thereof, the terminal pins being received in the holes of the header, with portions projecting therefrom for surface engagement with circuit traces on the printed circuit board; and
    spaced enlargement means on the terminal pins located on opposite sides of the header to retain the pins in the holes, the enlargement means being spaced along the pins a distance greater than the thickness of the header about the holes whereby the pins can float in the holes to accommodate any non-uniform spacing between the header and the printed circuit board and ensure contact between said portions of the terminal pins with the circuit traces.

2. The multi-pin electrical connector of claim 1 wherein said enlargement means are formed integral with the terminal pins.

3. The multi-pin electrical connector of claim 2 wherein said enlargement means are coined portions of the terminal pins.

4. The multi-pin electrical connector of claim 1 wherein said holes in the header have cross-sectional dimensions greater than the dimensions of the pins within the holes to provide for floating of the pins in a direction transversely of the holes.

5. The multi-pin electrical connector of claim 1 wherein said holes in the header have cross-sectional dimensions greater than the dimensions of the pins within the holes to provide for floating of the pins in a direction longitudinally of the holes.

6. A multi-pin electrical connector of claim 1 wherein said holes in the header have cross-sectional dimensions greater than the dimensions of the pins within the holes to provide for floating of the pins in an angular pivoting direction in the holes.

7. The multi-pin electrical connector of claim 1 wherein said terminal pins have greater masses on one side of said holes than the other side of the holes whereby the greater masses can be utilized to insure contact of the pins, by gravity, with the printed circuit board when the header is appropriately oriented.

8. A multi-pin electrical connector adapted for surface mounting on a printed circuit board, comprising;
    a header having a plurality of pin-receiving through holes;
    a plurality of male terminal pins of substantially constant cross section along the length thereof, the terminal pins being received in the holes of the header, with portions projecting therefrom for surface engagement with circuit traces on the printed circuit board, the terminal pins having integral enlarged portions located on opposite sides of the header to retain the pins in the holes, the enlarged portions being spaced a distance greater than the thickness of the header about the holes whereby the pins can float axially in the holes; and
    said holes in the header having cross-sectional dimensions greater than the dimensions of the pins within the holes to provide for floating of the pins.

9. The multi-pin electrical connector of claim 8 wherein said floating of said pins is in a direction transversely of the holes.

10. The multi-pin electrical connector of claim 8 wherein said floating of said pins is in a direction longitudinally of the holes.

11. The multi-pin electrical connector of claim 8 wherein said floating of said pins allows for the angular pivoting of the pins within the holes.

12. The multi-pin electrical connector of claim 8 wherein said enlargement means are coined portions of the terminal pins.

13. The multi-pin electrical connector of claim 8 wherein said terminal pins have greater masses on one side of said holes than the other side of the holes whereby the greater masses can be utilized to insure contact of the pins, by gravity, with the printed circuit board when the header is appropriately oriented.

14. A multi-pin electrical connector adapted for surface mounting on a printed circuit board, comprising:
    a housing having a plurality of horizontal pin-receiving through holes;
    a plurality of male terminal pins of substantially constant cross section along the length thereof, the terminal pins being received in the holes in the header;
    the holes in the header having cross-sectional dimensions greater than the dimensions of the pins within the holes to provide for floating of the pins in the holes in a vertical direction; and
    wherein said terminal pins have enlarged portions located on opposite sides of the housing to retain the pins in the holes.

15. The multi-pin electrical connector of claim 14 wherein said terminal pins have greater masses on one side of said holes than the other side of the holes whereby the greater masses can be utilized to insure contact of the pins, by gravity, with the printed circuit board when the housing is appropriately oriented.

16. The multi-pin electrical connector of claim 14 wherein said enlarged portions on the pins are spaced a greater distance than the thickness of the housing about the holes.

17. The multi-pin electrical connector of claim 14 wherein each said terminal pin includes a terminal portion projecting into the housing and a solder tail portion projecting outside the housing, the solder tail portion being bent at an angle to the terminal portion for surface mounting of a distal end of the solder tail portion to a circuit trace on the printed circuit board.

18. The multi-pin electrical connector of claim 17 wherein solder tail portion has a greater mass than the terminal portion.

19. A multi-pin electrical connector adapted for surface mounting on a printed circuit board, comprising:
a header having a plurality of generally vertical pin-receiving through holes;
a plurality of terminal pins received in the holes of the header, each terminal pin having a vertical terminal portion projecting upwardly of the header, a pair of spaced enlarged portions along the terminal portion on opposite sides of the header and of greater dimensions than the cross-dimensions of the hole to retain the pin in the hole, and a solder tail portion below the header and bent at an angle to the terminal portion for surface engagement with a circuit trace on the printed circuit board, the enlarged portions on the pin being spaced a distance greater than the thickness of the header about the hole whereby the pin can float vertically in the hole to accommodate any non-uniform spacing between the header and the printed circuit board and ensure engagement of the solder tail portion with the circuit trace on the printed circuit board.

* * * * *